(12) United States Patent
Sharma et al.

(10) Patent No.: US 6,646,343 B1
(45) Date of Patent: Nov. 11, 2003

(54) MATCHED IMPEDANCE BONDING TECHNIQUE IN HIGH-SPEED INTEGRATED CIRCUITS

(75) Inventors: Nirmal Sharma, Fremont, CA (US); Ge Gong, Santa Clara, CA (US); Jason Chen, San Jose, CA (US)

(73) Assignee: BitBlitz Communications, Inc., Milpitas, CA (US)

( * ) Notice: Subject to any disclaimer, the term of this patent is extended or adjusted under 35 U.S.C. 154(b) by 0 days.

(21) Appl. No.: 10/173,210

(22) Filed: Jun. 14, 2002

(51) Int. Cl.[7] .............................. H01L 23/34
(52) U.S. Cl. ................ 257/728; 257/786; 257/691
(58) Field of Search ............................ 257/728, 786, 257/691

(56) References Cited

U.S. PATENT DOCUMENTS

| | | | | |
|---|---|---|---|---|
| 4,891,686 A | * | 1/1990 | Krausse, III | 174/252 |
| 6,064,113 A | * | 5/2000 | Kirkman | 257/691 |
| 6,437,669 B1 | * | 8/2002 | Welstand et al. | 333/246 |
| 6,538,336 B1 | * | 3/2003 | Secker et al. | 257/786 |

* cited by examiner

Primary Examiner—David Nelms
Assistant Examiner—Tu-Tu Ho
(74) Attorney, Agent, or Firm—Edward C. Kwok; MacPherson Kwok Chen & Heid LLP

(57) ABSTRACT

A method and an integrated circuit package support a high-speed integrated circuit operating at 10 GHz or higher switching speeds. The packaged integrated circuit has external terminals, a semiconductor die having conventional bonding pads, a substrate (e.g., printed circuit board) having conductive traces to couple input, output or bi-directional signals between bonding finger areas of the conductive traces and the external terminals. A ground plate that is electrically isolated from a conductive trace is positioned in the vicinity of the bonding finger area of the conductive trace. Bond wires connect the bonding pads of the electronic circuit and the bonding finger areas of the conductive traces. The ground plate improves integrity in a high-speed signal by canceling the complex impedance of a bond wire. In addition, the packaged integrated circuit can use multiple bond wires to connect the same bonding finger area of a conductive trace on the substrate and a corresponding bonding pad of the electronic circuit. The multiple bond wire approach reduces inductance in the bond wires.

12 Claims, 5 Drawing Sheets

US 6,646,343 B1

MATCHED IMPEDANCE BONDING TECHNIQUE IN HIGH-SPEED INTEGRATED CIRCUITS

FIELD OF THE INVENTION

The present invention relates generally to a package for an integrated circuit. In particular, the present invention relates to techniques for wire-bonding of electrical connections between leads of an integrated circuit package and a high-speed integrated circuit formed on a semiconductor substrate.

DISCUSSION OF THE RELATED ARTS

An integrated circuit typically includes a plastic or ceramic package that encapsulates an electronic circuit formed on a semiconductor substrate ("semiconductor die"). Typically, terminals are provided on the package for external connections. In one type of package, known as a "ball grid array" (BGA) package, the external terminals provide solder balls which can be bonded onto conductive traces on a printed circuit board for connection to other circuit elements provided on the printed circuit board.

FIG. 1 shows a cross section of "cavity down" BGA package 100, which includes semiconductor die 101 provided in cavity 108, multi-layer circuit board 102, solder balls 103 and bond wires 104. Multi-layer circuit board 102 includes a number of conductor layers insulated from each other by one or more layers of dielectric material. The conductor layers are each patterned to route a signal or a reference potential to an external terminal provided by solder balls 103. As shown in FIG. 1, bond wires 104 connect the conductor traces on multi-layer circuit board 102 to semiconductor die 101's bonding pads, which are input and output ports of an electronic circuit fabricated on semiconductor die 101. The conductor traces are conductors etched or laminated on different layers of insulators in multi-layer circuit board 102. These conductor traces are connected to other layers of conductor traces and solder balls 103 by vias 105.

In a high-speed integrated circuit, such as one operating at the 10 gigahertz (10 GHz) range, the complex impedance (e.g., inductance) introduced by bond wires can significantly affect signal quality by distorting signal waveforms and introducing noise. It is believed that a conventional wire-bonded BGA package cannot support a 1 GHz integrated circuit.

SUMMARY OF THE INVENTION

The present invention provides a method and an integrated circuit package that can support a high-speed integrated circuit operating at 10 GHz or higher switching speeds.

According to one embodiment of the present invention, a packaged integrated circuit having external terminals is provided a semiconductor die having conventional bonding pads, a substrate (e.g., printed circuit board) having conductive traces to couple input, output or bi-directional signals between bonding finger areas of the conductive traces and the external terminals. In one embodiment, a ground plate that is electrically isolated from a conductive trace is positioned in the vicinity of the bonding finger area of the conductive trace. Bond wires connect the bonding pads of the electronic circuit and the bonding finger areas of the conductive traces. The ground plate improves integrity in a high-speed signal by canceling the complex impedance of a bond wire.

According to another aspect of the invention, a packaged integrated circuit of the present invention can use two or more bond wires to connect the same bonding finger area of a conductive trace on the substrate and a corresponding bonding pad of the electronic circuit. In one embodiment, the packaged integrated circuit is a ball grid array package, which includes a multi-layer circuit board. The multiple bond wire approach reduces inductance in the bond wires.

In one embodiment of the present invention, a second conductive trace is provided adjacent the first conductive trace, so as to allow the first and second conductive traces to carry a differential signal to and from the electronic circuit. In that embodiment, a third conductive trace is provided on the substrate for receiving a reference signal, the third conductive trace being provided to substantially shield the first and second conductive traces.

The present invention is better understood upon consideration of the detailed description below and the accompanying drawings.

BRIEF DESCRIPTION OF THE DRAWINGS

To facilitate cross-reference among the figures and to simplify the detailed description, like elements in the figures are provided like reference numerals.

DETAILED DESCRIPTION OF THE PREFERRED EMBODIMENTS

The present invention provides a method and an integrated circuit package that can support a high-speed integrated circuit operating at 1 GHz or higher switching speeds.

Figure 1:
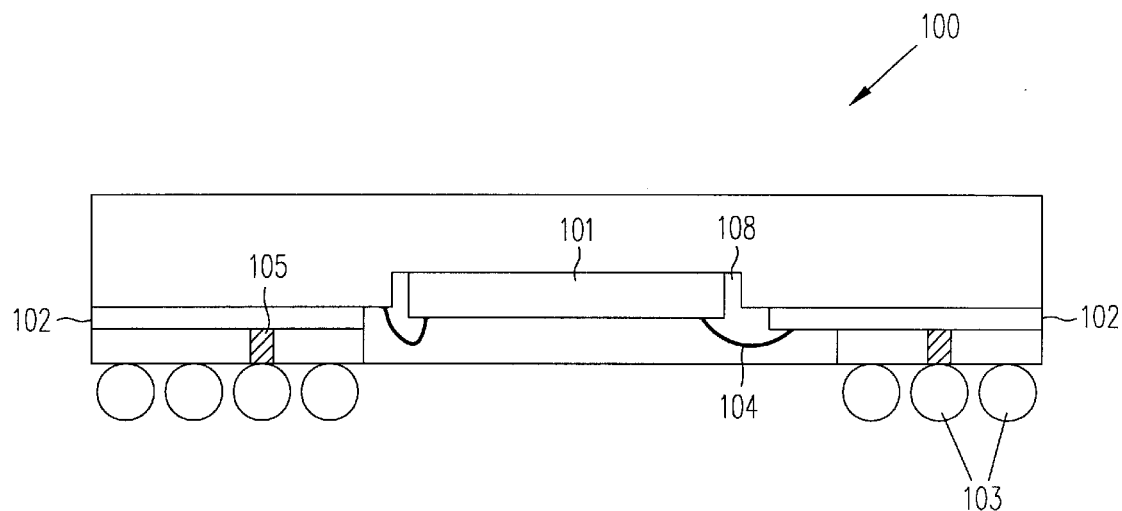
FIG. 1 shows a cross section of a prior art "cavity down" BGA package 100, which includes semiconductor die 101, multi-layer circuit board 102, solder balls 103 and bond wires 104.
Figure 2:
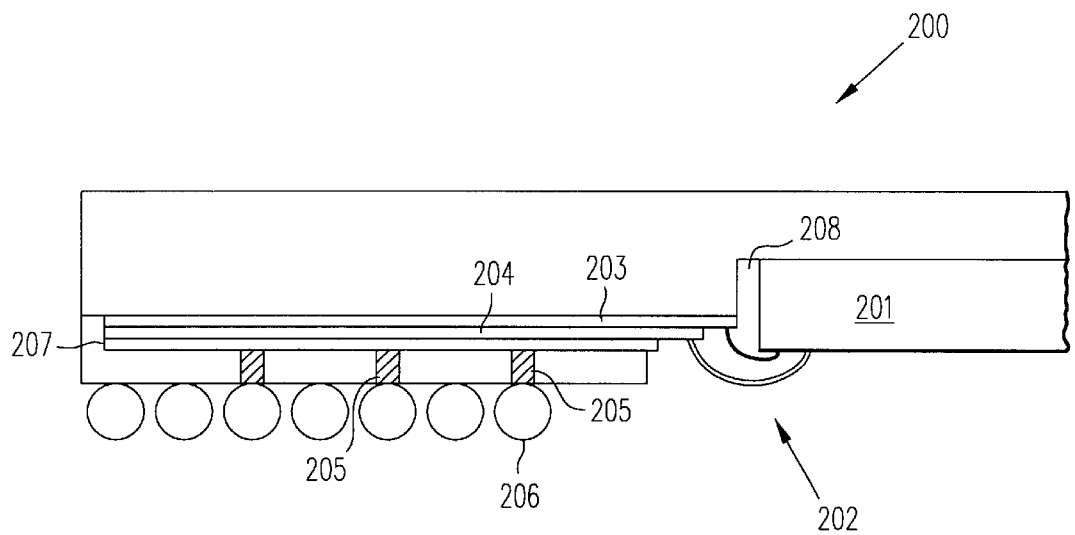
FIG. 2 shows a cross section of one half of a "cavity down" BGA package 200, in accordance with one embodiment of the present invention.

FIG. 2 shows a cross section of one half of a "cavity down" BGA package 200, in accordance with one embodiment of the present invention. (The other half of package 200 mirrors the half shown in FIG. 2). As shown in FIG. 2, BGA package 200 encapsulates semiconductor die 201 in a conventional manner. According to the present invention, however, multi-layer circuit board 207 includes in layer 203 a ground plate underneath the bond fingers at the periphery area adjacent cavity 208 in which semiconductor die 201 is provided. As shown in FIG. 2, according to another aspect of the present invention which is illustrated in further detail in FIG. 3, a "double" bond wire is provided to connect a bond pad to a corresponding bond finger on multi-layer circuit board 207. In this embodiment, a double bond wire include two or more bond wires of 0.03 mm in diameter, set apart along a 0.25 mm gap. In this embodiment, package 200 includes a 25 mm deep cavity, and semiconductor die 202 is provided such that it is less than 0.1 mm higher than the bonding surface of 3.5-layer multi-layer circuit board 207, and spaced 0.8 mm apart. Solder balls 206 and vias 205 can be provided in a conventional manner.

Figure 3:
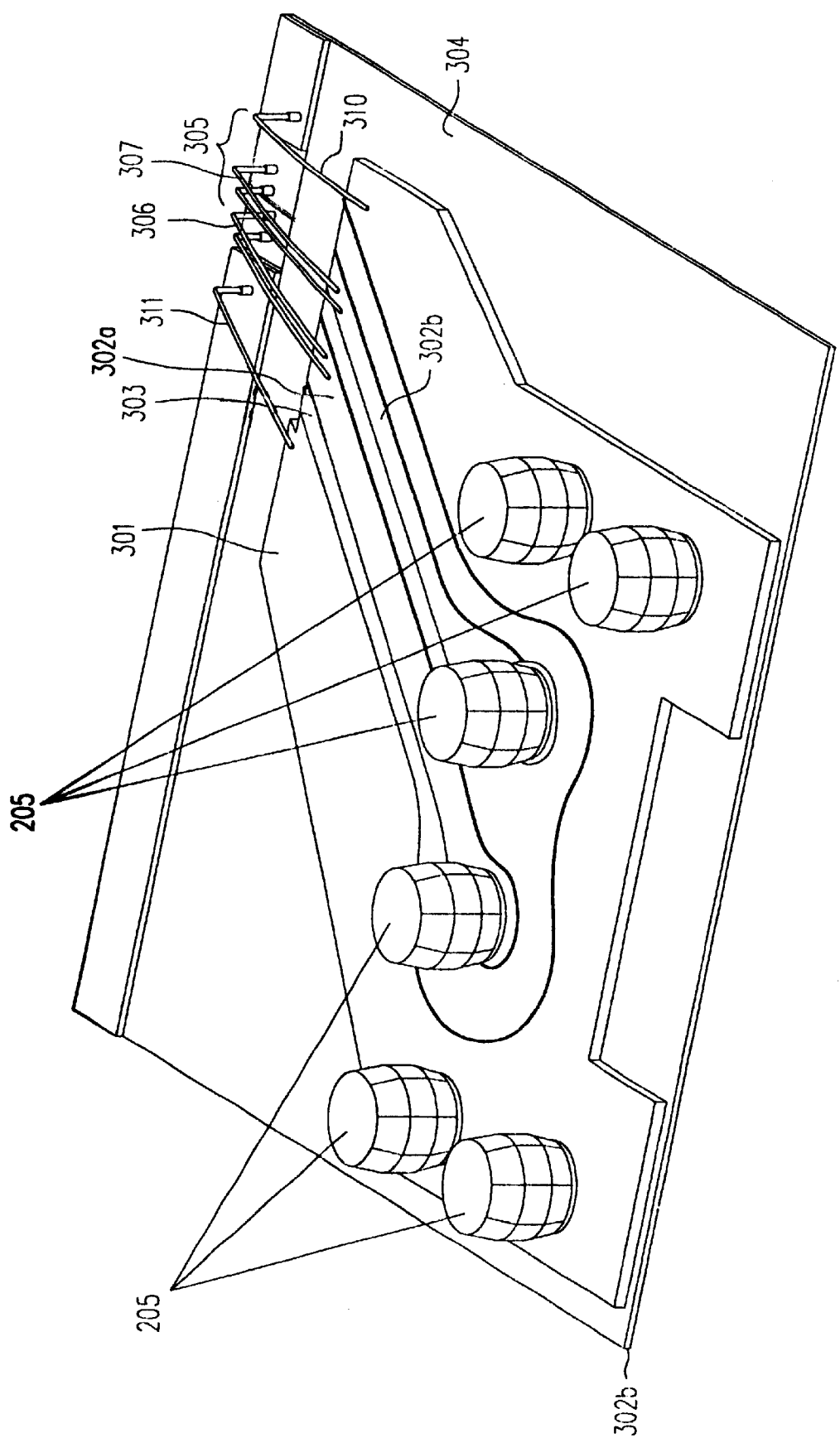
FIG. 3 shows a computer-generated model of a portion of integrated circuit package 200.

FIG. 3 shows a computer-generated model of a portion of integrated circuit package 200. As shown in FIG. 3, area 305 represents an area on semiconductor die 201 providing two bond pads carrying a high-speed differential signal. The bond pads are respectively connected by double bond wires 306 and 307 to corresponding conductor traces 302a and 302b on multi-layer circuit board 207. Referring back to FIG. 2, vias 205 connect conductor traces 302a and 302b to corresponding solder balls (not shown). In FIG. 3, ground trace 301 in a conductor layer of multi-layer circuit board 207 separate from conductor traces 302a and 302b surrounds conductor traces 302a and 302b. Ground trace 301 is connected to corresponding ground bonding pads on semiconductor die 201 by bond wires 310 and 311. In addition, ground plate 303 of another conductor layer separate from the conductor layers of conductor traces 302a, 302b and 301 is provided underneath the bonding finger area of conductor traces 302a and 302b.

Figure 4:
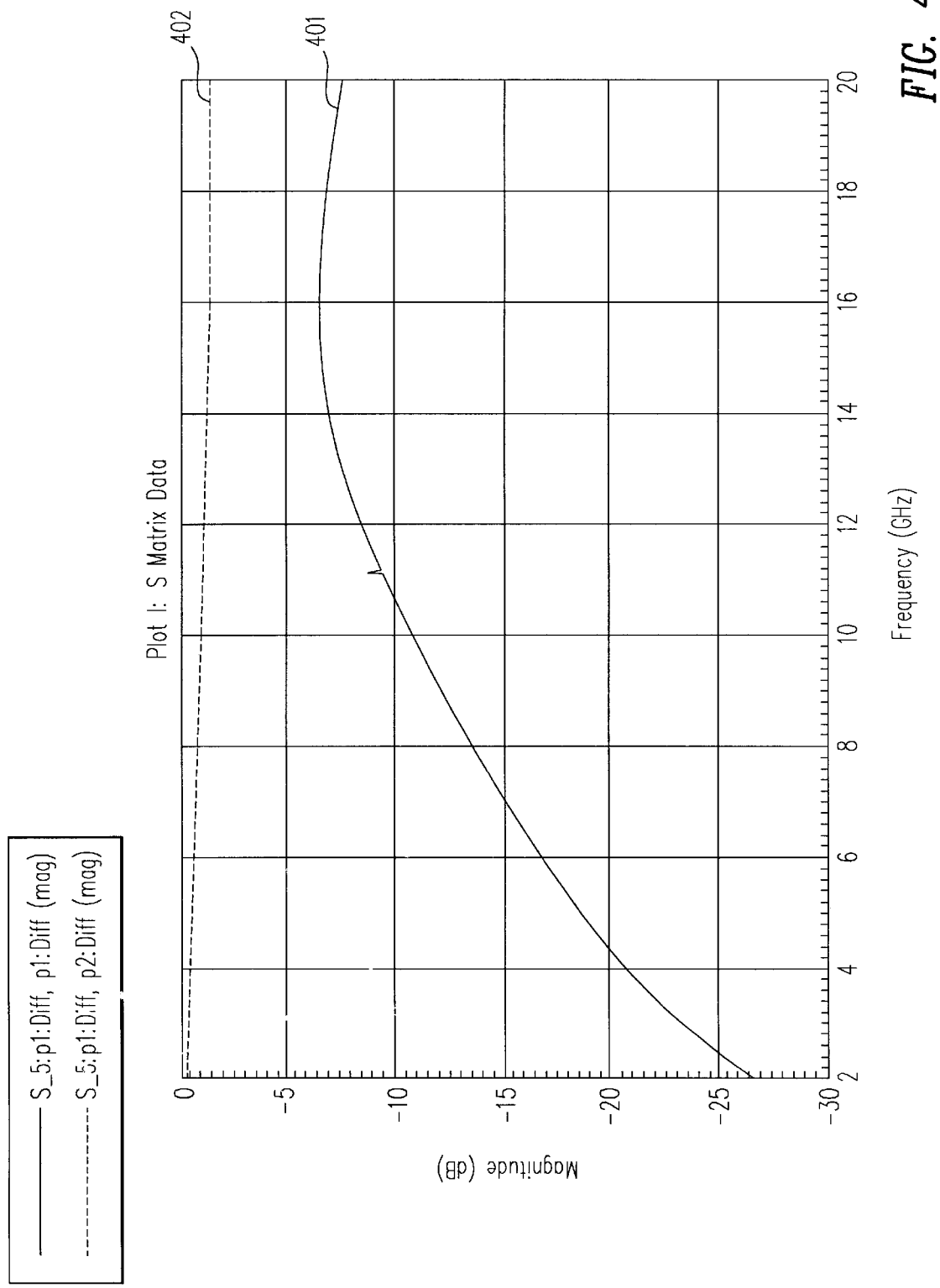
FIG. 4 is a S-matrix plot that shows signal return loss 401 in the bond wire and the conductive traces and transmission loss 402 in the bond wire and the conductive traces under the arrangement of FIG. 3, using single bond wires rather than double bond wires 306 and 307, and without ground plate 303.
Figure 5:
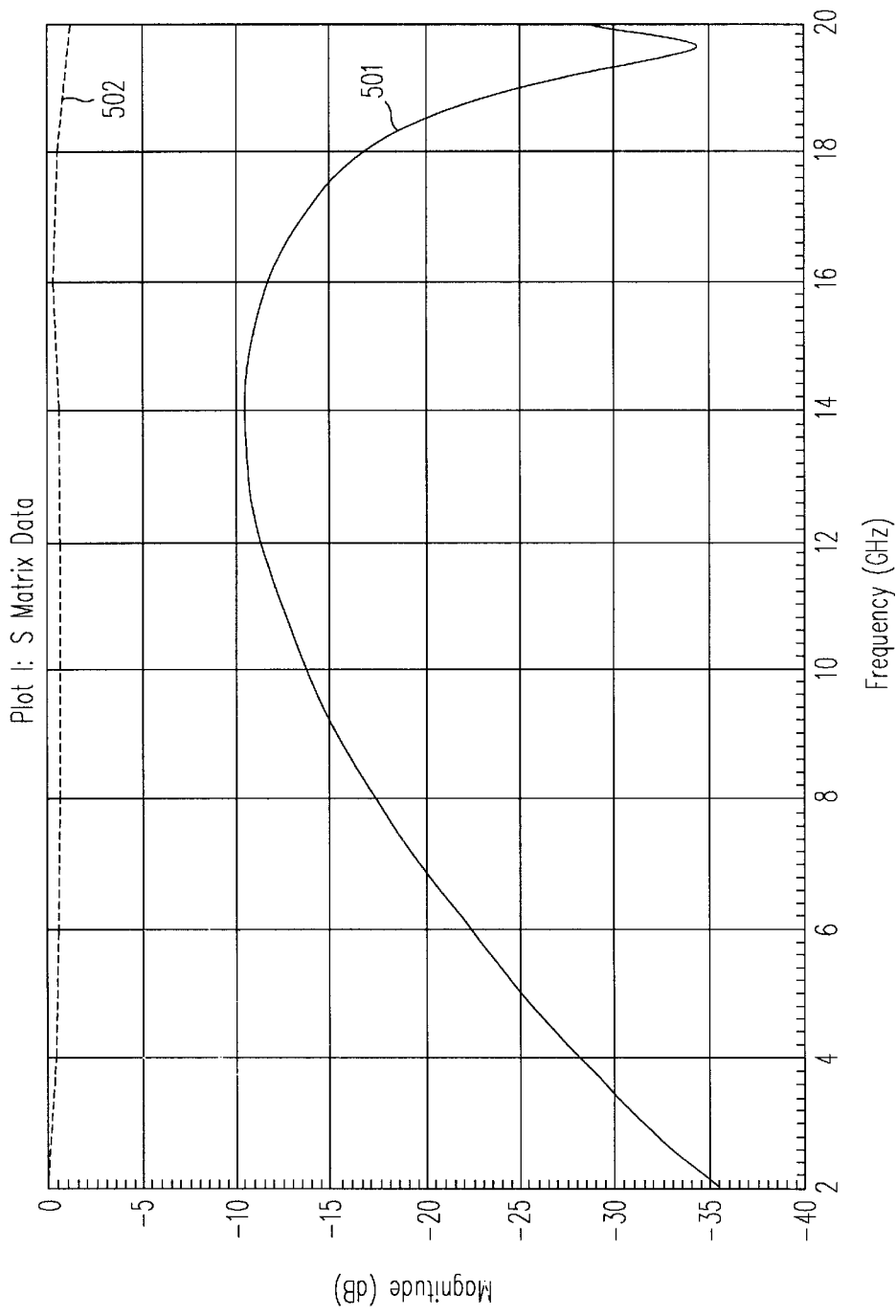
FIG. 5 is the S-matrix plot that shows return loss 501 in the bond wire and transmission loss 502 in the bond wire under the conditions of FIG. 4, but including ground plate 303.
Figure 6:
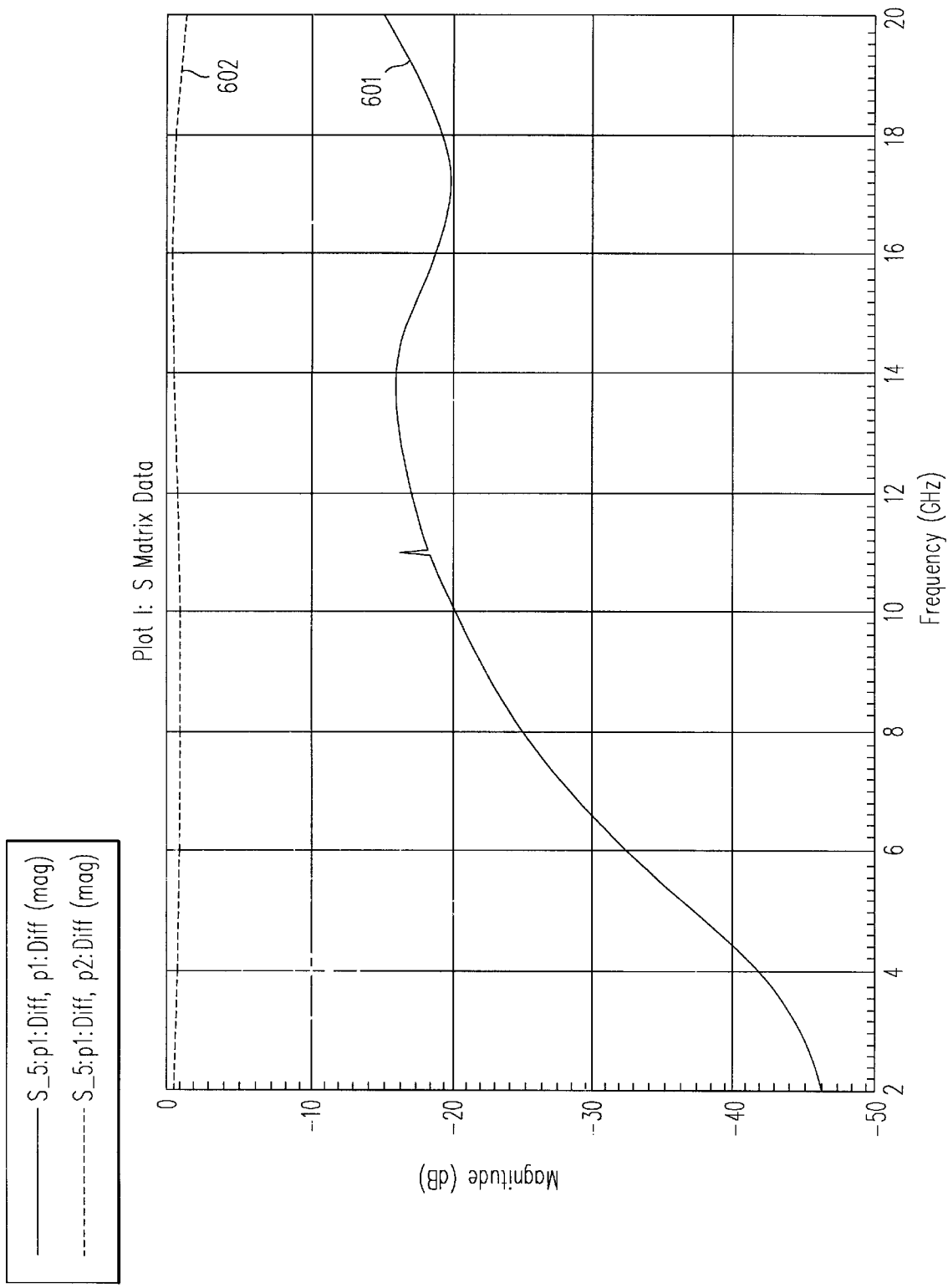
FIG. 6 is the S-matrix plot that shows return loss 601 in the bond wire and transmission loss in the bond wire under the conditions of FIG. 5, further including double bond wires 306 and 307.

FIGS. 4–6 are S-matrix simulations illustrating the surprising results achieved in the present invention. Specifically, FIG. 4 is a S-matrix plot that shows signal return loss 401 in the bond wire and the conductive traces (due to reflection) and transmission loss 402 in the bond wire and the conductive traces under the arrangement of FIG. 3, using single bond wires rather than double bond wires .306 and 307, and without ground plate 303. In other words, FIG. 4 shows the electrical characteristics of a BGA package 200 prior to applying the present invention. Signal return loss in the bond wire represents signal reflection due to impedance mismatch between bond wire and the conductive traces in the package. As shown in FIG. 4, both return loss in the bond wire (trace 401) and transmission loss in the bond wire (trace 402) deteriorate as operating frequency increases. For the purpose of comparison, at 10 GHz operating frequency, signal loss in data path from the tip of the bond wire to the solder ball is −11 dB, and isolation signal loss is about −1.5 dB.

FIG. 5 is the S-matrix plot that shows signal attenuation in the bond wire and the conductive traces due to transmission and reflection under the conditions of FIG. 4, but including ground plate 303. As seen in FIG. 5, introducing ground plate 303 reduces signal return loss in the bond wire to −14 dB at 10 GHz (curve 501), and improves transmission loss to −1.0 dB (curve 502). This improvement is believed due to a cancellation of the complex impedance of the bond wire by ground plate 303.

FIG. 6 is the S-matrix plot that shows signal attenuation in the bond wire and in the conductive traces under the conditions of FIG. 5, further including double bond wires 306 and 307. That is, FIG. 6 shows the electrical characteristics of a BGA package having both the ground plate and the double wire features shown in FIG. 3. As seen in FIG. 6, introducing double bond wires 306 and 307 further reduces signal return loss in the bond wire to −20 dB at 10 GHz (curve 601), and improves transmission loss to −0.5 dB (curve 602). This improvement over the electrical characteristics of FIG. 5 is believed due to a lower inductance of a double bond wire relative to a single bond wire.

The above detailed description is provided to illustrate specific embodiments of the present invention and is not intended to be limiting. Numerous variations and modifications within the scope of the present invention are possible. For example, although the present invention is illustrated above using a BGA package, the present invention is also applicable to other packages, such as ceramic or plastic leadless packages and packages with lead frames. The present invention is set forth in the following claims.

What is claimed is:

1. A packaged integrated circuit having an external terminal, comprising:
    a semiconductor die having provided an electronic circuit thereon, the electronic circuit including a bonding pad;
    a substrate providing a first conductive trace to couple a signal between a bonding finger area of the first conductive trace and the external terminal, and a ground plate that is electrically isolated from the first conductive trace and positioned underneath and in the vicinity of the bonding finger area, the ground plate having an extended portion extending beyond the bonding finger area of the first conductive trace towards the bonding pad; and
    a bond wire situated over the extended portion of the ground plate connecting the bonding pad of the electronic circuit and the bonding finger area of the first conductive trace.

2. A packaged integrated circuit as in claim 1, further comprising a second bond wire connecting the bonding finger area of the conductive trace and the bonding pad of the electronic circuit.

3. A packaged integrated circuit as in claim 1, wherein the packaged integrated circuit comprises a ball grid array package.

4. A packaged integrated circuit as in claim 1, wherein the substrate comprises a multi-layer circuit board.

5. A packaged integrated circuit as in claim 1, wherein a second conductive trace is provided adjacent the first conductive trace, and wherein the first and second conductive traces are provided to carry a differential signal.

6. A packaged integrated circuit as in claim 5, further comprising a third conductive trace substantially shielding the first and second conductive traces.

7. In a packaged integrated circuit having an external terminal, a method comprising:
    including in an integrated circuit package a semiconductor die that is formed thereon an electronic circuit, the electronic circuit including a bonding pad;
    providing a substrate having a first conductive trace formed thereon to couple a signal between a bonding finger area of the first conductive trace and the external terminal, and a ground plate that is electrically isolated from the first conductive trace and positioned underneath and in the vicinity of the bonding finger area, the ground plate having an extended portion extending beyond the bonding finger area of the first conductive trace towards the bonding pad; and
    providing a bond wire situated above the extended portion of the ground plate to connect the bonding pad of the electronic circuit and the bonding finger area of the first conductive trace.

8. A method as in claim 7, further comprising connecting a second bond wire between the bonding finger area of the conductive trace and the bonding pad of the electronic circuit.

9. A method as in claim 7, wherein the packaged integrated circuit comprises a ball grid array package.

10. A method as in claim 7, wherein the substrate comprises a multi-layer circuit board.

11. A method as in claim 7, further comprising providing a second conductive trace adjacent the first conductive trace, and providing the first and second conductive traces to carry a differential signal.

12. A method as in claim 11, further comprising providing a third conductive trace substantially shielding the first and second conductive traces.

* * * * *